United States Patent
Lai et al.

(10) Patent No.: US 9,455,403 B1
(45) Date of Patent: Sep. 27, 2016

(54) SEMICONDUCTOR STRUCTURE AND METHOD FOR MANUFACTURING THE SAME

(71) Applicant: MACRONIX INTERNATIONAL CO., LTD., Hsinchu (TW)

(72) Inventors: Erh-Kun Lai, Taichung (TW); Feng-Min Lee, Hsinchu (TW); Yu-Yu Lin, New Taipei (TW); Dai-Ying Lee, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/838,500

(22) Filed: Aug. 28, 2015

(51) Int. Cl.
*H01L 27/24* (2006.01)
*H01L 45/00* (2006.01)

(52) U.S. Cl.
CPC ....... *H01L 45/1233* (2013.01); *H01L 27/2436* (2013.01); *H01L 45/1253* (2013.01); *H01L 45/146* (2013.01); *H01L 45/1633* (2013.01); *H01L 45/1683* (2013.01)

(58) Field of Classification Search
CPC ............ H01L 2924/1443; H01L 2924/14365; H01L 2924/1437; H01L 23/53238; H01L 23/53266; H01L 23/00; H01L 2924/00; H01L 2924/1441; H01L 45/1233; H01L 45/1253; H01L 45/1633; H01L 27/2436; H01L 27/222; H01L 27/10823; H01L 27/226; H01L 27/14689
See application file for complete search history.

(56) References Cited

U.S. PATENT DOCUMENTS

| | | | |
|---|---|---|---|
| 7,933,139 B2 | 4/2011 | Lung | |
| 9,129,894 B2 * | 9/2015 | Hashim | G11C 13/0007 |
| 2006/0081961 A1 * | 4/2006 | Tanaka | H01L 27/112 |
| | | | 257/536 |
| 2009/0140232 A1 * | 6/2009 | Ufert | H01L 27/2436 |
| | | | 257/4 |
| 2009/0230556 A1 | 9/2009 | Mikawa et al. | |
| 2015/0194314 A1 | 7/2015 | Chu et al. | |

FOREIGN PATENT DOCUMENTS

| | | |
|---|---|---|
| TW | 201040963 A1 | 11/2010 |
| TW | 104109448 | 3/2015 |
| TW | 201528346 A | 7/2015 |

OTHER PUBLICATIONS

S. Kobayashi et al. "64Kbit CMVP FeRAM macro with reliable retention/imprint characteristics" Electron Devices Meeting, 2000. IEDM '00. Technical Digest. International. pp. 783-786, Dec. 10-Dec. 13, 2000.
TIPO Office Action dated May 12, 2016 in Taiwan application (No. 104128847).

* cited by examiner

*Primary Examiner* — Jasmine Clark
(74) *Attorney, Agent, or Firm* — McClure, Qualey & Rodack, LLP (57) ABSTRACT

A semiconductor structure and a method for manufacturing the same are provided. The semiconductor structure comprises an access device, a dielectric layer, a barrier layer, a first interlayer conductor, a first barrier liner, a second interlayer conductor, a second barrier liner, a memory element and a top electrode layer. The access device has two terminals. The dielectric layer covers the access device. The barrier layer is disposed on the dielectric layer. The first and second interlayer conductors are connected to the two terminals, respectively. The first and second barrier liners are disposed on sidewalls of the first and second interlayer conductors, respectively. The memory element is disposed on the first interlayer conductor. The top electrode layer is disposed on the barrier layer and the memory element and covers the memory element.

20 Claims, 11 Drawing Sheets

SEMICONDUCTOR STRUCTURE AND METHOD FOR MANUFACTURING THE SAME

TECHNICAL FIELD

This disclosure relates to a semiconductor structure and a method for manufacturing the same. More particularly, this disclosure relates to a semiconductor structure comprising a barrier structure, especially a hydrogen barrier structure, and a method for manufacturing the same.

BACKGROUND

Resistive random access memory (RRAM) is a type of nonvolatile memory that provides the benefits of simple structure, small cell size, scalability, ultrafast operation, low-power operation, high endurance, good retention, large On/Off ratio, CMOS compatibility, low cost, etc. One type of RRAM comprises a memory element, such as a metal oxide layer. For example, by application of electrical pulses, the resistance of the memory element may be changed between two or more stable resistance ranges.

In a CMOS manufacturing process, some steps may be conducted under a gas atmosphere comprising hydrogen ($H_2$). In addition, some components of the manufactured structure may release hydrogen, for example, during a high-temperature step of the manufacturing process. The hydrogen may be disadvantageous for the retention of the memory element.

SUMMARY

In light of the above, a semiconductor structure and a method for manufacturing the same are provided. In particular, the semiconductor structure comprises a barrier structure, especially a hydrogen barrier structure.

According to some embodiments, the semiconductor structure comprises an access device, a dielectric layer, a barrier layer, a first interlayer conductor, a first barrier liner, a second interlayer conductor, a second barrier liner, a memory element and a top electrode layer. The access device has two terminals. The dielectric layer covers the access device. The barrier layer is disposed on the dielectric layer. The first interlayer conductor extends through the barrier layer and the dielectric layer. The first interlayer conductor is connected to one of the two terminals. The first barrier liner is disposed on a sidewall of the first interlayer conductor, wherein the first interlayer conductor is physically separated from the dielectric layer by the first barrier liner. The second interlayer conductor extends through the barrier layer and the dielectric layer. The second interlayer conductor is connected to the other one of the two terminals. The second barrier liner is disposed on a sidewall of the second interlayer conductor, wherein the second interlayer conductor is physically separated from the dielectric layer by the second barrier liner. The memory element is disposed on the first interlayer conductor. The top electrode layer is disposed on the barrier layer and the memory element, and the top electrode layer covers the memory element.

According to some embodiments, the method comprises the following steps. A preliminary structure is provided. The preliminary structure comprises an access device and a dielectric layer covering the access device, wherein the access device has two terminals. A barrier layer is formed on the dielectric layer. Two holes are formed through the barrier layer and the dielectric layer. The two holes expose portions of the two terminals, respectively. A first barrier liner and a second barrier liner are formed on sidewalls of the two holes, respectively. A first interlayer conductor and a second interlayer conductor are formed in the two holes, respectively. The first interlayer conductor is connected to one of the two terminals and physically separated from the dielectric layer by the first barrier liner, and the second interlayer conductor is connected to the other one of the two terminals and physically separated from the dielectric layer by the second barrier liner. Then, a memory element is formed on the first interlayer conductor. A top electrode layer is formed on the barrier layer and the memory element, wherein the top electrode layer covers the memory element.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the disclosure is directed to a semiconductor structure and a method for manufacturing the same with reference to accompany drawings. For ease of illustration, the description is focused on a semiconductor structure comprising a RRAM device. However, the disclosure is not limited thereto. For example, the barrier structure illustrated in the following description may be used in other structures. It is noted that, for clarity of understanding, in the accompany drawings, sizes of the elements may not reflect the actual sizes thereof.

Figure 1:
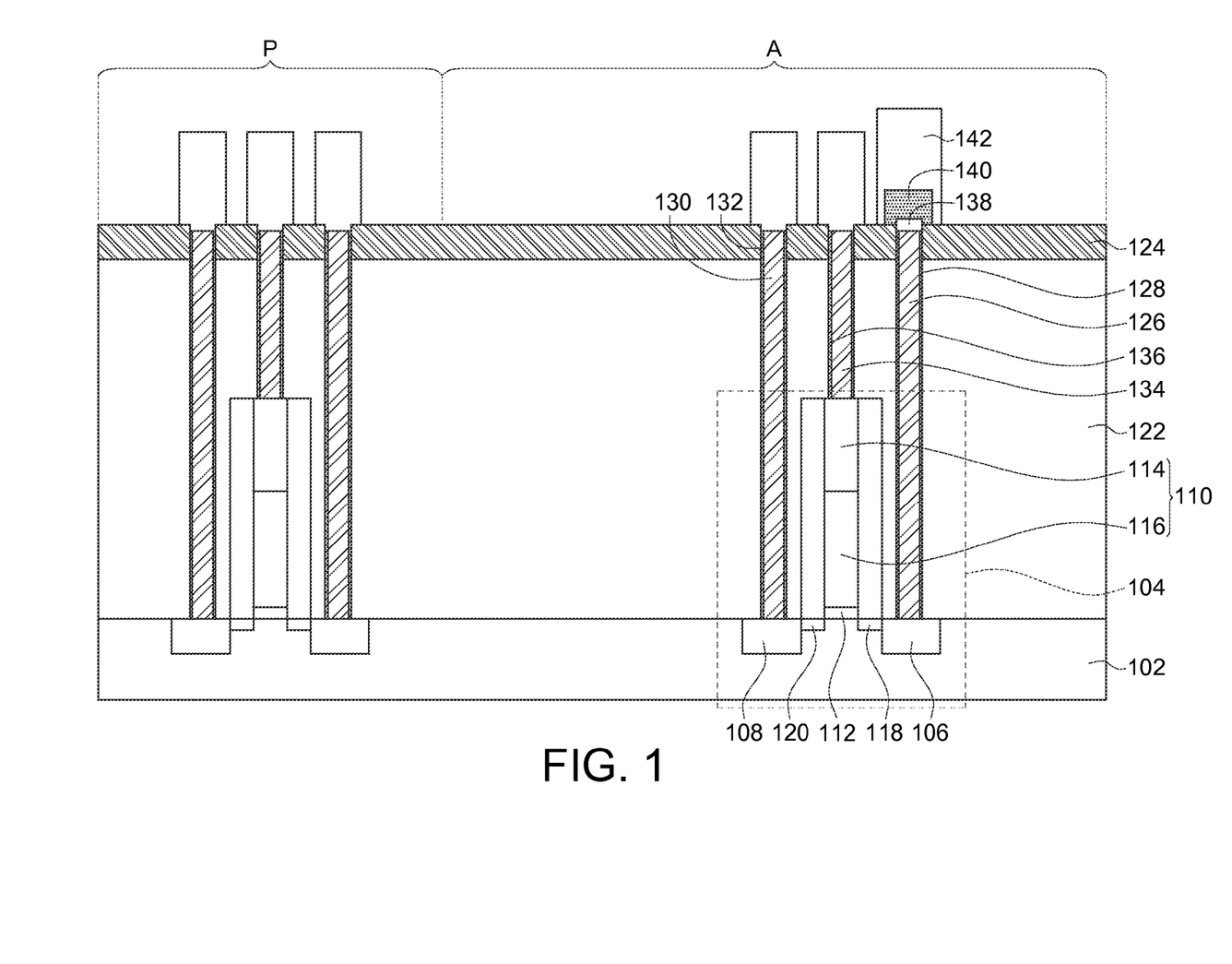
FIG. 1 illustrates a semiconductor structure according to embodiments.

FIG. 1 shows a semiconductor structure according to embodiments. The semiconductor structure comprises an access device 104. The access device 104 has two terminals (106 and 108). Typically, for a RRAM device, the access device may be a transistor or a diode. In FIG. 1, the access device 104 is shown as a transistor (such as a NMOS) comprising two source/drain regions 106 and 108 and a gate electrode 110. More specifically, the semiconductor structure may comprise a substrate 102, the source/drain regions 106 and 108 are disposed in the substrate 102, and the source/drain regions 106 and 108 are said two terminals. The gate electrode 110 is disposed on the substrate 102 between the source/drain regions 106 and 108, and the gate electrode 110 is separated from the substrate 102 by a gate dielectric 112 of the transistor. According to one embodiment, as shown in FIG. 1, the gate electrode 110 may comprise an upper layer 114 and a lower layer 116, the upper layer 114 comprises metal silicide, such as $CoSi_x$ or $WSi_x$, and the lower layer 116 comprises polysilicon. The transistor may further comprise two light-doped drift regions 118 and 120.

The semiconductor structure further comprises a dielectric layer 122. The dielectric layer 122 covers the access device 104. For example, the dielectric layer 122 is disposed on the substrate 102 and the access device 104, and covers the access device 104. Here, the dielectric layer 122 may be used as an interlayer dielectric layer.

The semiconductor structure further comprises a barrier layer 124. The barrier layer 124 is disposed on the dielectric layer 122. The barrier layer 124 may comprise a material having a hydrogen barrier effect, such as silicon nitride ($SiN_x$).

The semiconductor structure further comprises a first interlayer conductor 126, a first barrier liner 128, a second interlayer conductor 130 and a second barrier liner 132. The first interlayer conductor 126 extends through the barrier layer 124 and the dielectric layer 122. The first interlayer conductor 126 is connected to one of the two terminals (106). The first barrier liner 128 is disposed on a sidewall of the first interlayer conductor 126, wherein the first interlayer conductor 126 is physically separated from the dielectric layer 122 by the first barrier liner 128. The second interlayer conductor 130 extends through the barrier layer 124 and the dielectric layer 122. The second interlayer conductor 130 is connected to the other one of the two terminals (108). The second barrier liner 132 is disposed on a sidewall of the second interlayer conductor 130, wherein the second interlayer conductor 130 is physically separated from the dielectric layer 122 by the second barrier liner 132. In the cases of the access device 104 is a transistor, the semiconductor structure may further comprise a third interlayer conductor 134 and a third barrier liner 136. The third interlayer conductor 134 extends through the barrier layer 124 and the dielectric layer 122. The third interlayer conductor 134 is connected to the gate electrode 110. The third barrier liner 136 is disposed on a sidewall of the third interlayer conductor 134, wherein the third interlayer conductor 134 is physically separated from the dielectric layer 122 by the third barrier liner 136. Here, when describing an element is "connected to" another element, the element is "electrically and optionally physically connected to" the another element. The first interlayer conductor 126, the second interlayer conductor 130 and the third interlayer conductor 134 may comprise tungsten (W). The first barrier liner 128, the second barrier liner 132 and the third barrier liner 136 may comprise a material having a hydrogen barrier effect, such as silicon nitride ($SiN_x$).

The semiconductor structure further comprises a memory element 138 and a top electrode layer 140. The memory element 138 is disposed on the first interlayer conductor 126. The top electrode layer 140 is disposed on the barrier layer 124 and the memory element 138, and the top electrode layer 140 covers the memory element 138. The memory element 138 may have a programmable resistance for the RRAM application, and the material can be used to form the memory element 138 comprises tungsten oxide, nickel oxide, aluminum oxide, magnesium oxide, cobalt oxide, titanium oxide, titanium-nickel oxide, zirconium oxide, copper oxide, and the like. In particular, the memory element 138 may comprise tungsten oxide, such as $WO_3$, $W_2O_5$, $WO_2$, or $WO_x$ with an oxygen gradient. As such, the semiconductor structure comprises a RRAM device comprising the memory element 138, and the top electrode layer 140 and the first interlayer conductor 126 provide the top and bottom electrodes of the memory element 138. The memory element 138 is controllable by the access device 104 by the connection with one of the terminals (106) of the access device 104 through the first interlayer conductor 126. In some embodiments, the memory element 138 is connected to the drain region of the transistor. The top electrode layer 140 may comprise a conductive material for providing the top electrode. Further, the top electrode layer 140 may comprise a material having a hydrogen barrier effect. According to some embodiments, the top electrode layer 140 may comprise titanium (Ti), titanium nitride (TiN) or titanium aluminum nitride (TiAlN). According to one embodiment, the memory element 138 may have a thickness of about 10 Å to about 1000 Å, such as 100 Å. For example, the barrier layer 124 may be about 30 Å to about 1000 Å, generally be about 100 Å to about 200 Å. The memory element 138 may be about 10 Å to about 500 Å, typically be about 100 Å. The top electrode layer 140 may be about 50 Å to about 1000 Å, typically be about 200 Å to about 300 Å.

The semiconductor structure may further comprise a metal layer 142 disposed on the dielectric layer 122. The metal layer 142 is connected to the top electrode layer 140, the second interlayer conductor 130 and the third interlayer conductor 134.

The semiconductor structure may comprise an array region A and a peripheral region P. The components described above are typically disposed in the array region A. However, generally, except for the memory element 138 and the top electrode layer 140, other components may also be disposed in the peripheral region P in a similar manner.

According to the embodiments, the first barrier liner 128, the second barrier liner 132, the third barrier liner 136, the barrier layer 124 and the top electrode layer 140 may be configured to be hydrogen barriers. More specifically, the first barrier liner 128, the second barrier liner 132 and the third barrier liner 136 prevent a hydrogen diffusion from the dielectric layer 122 to the first interlayer conductor 126, the second interlayer conductor 130 and the third interlayer conductor 134, respectively. The barrier layer 124 and the top electrode layer 140 prevent a hydrogen diffusion from a processing atmosphere or other components to the memory element 138. As such, a degradation of the semiconductor structure (especially the memory element thereof) caused by the hydrogen diffusion may be prevented.

Figure 2A:
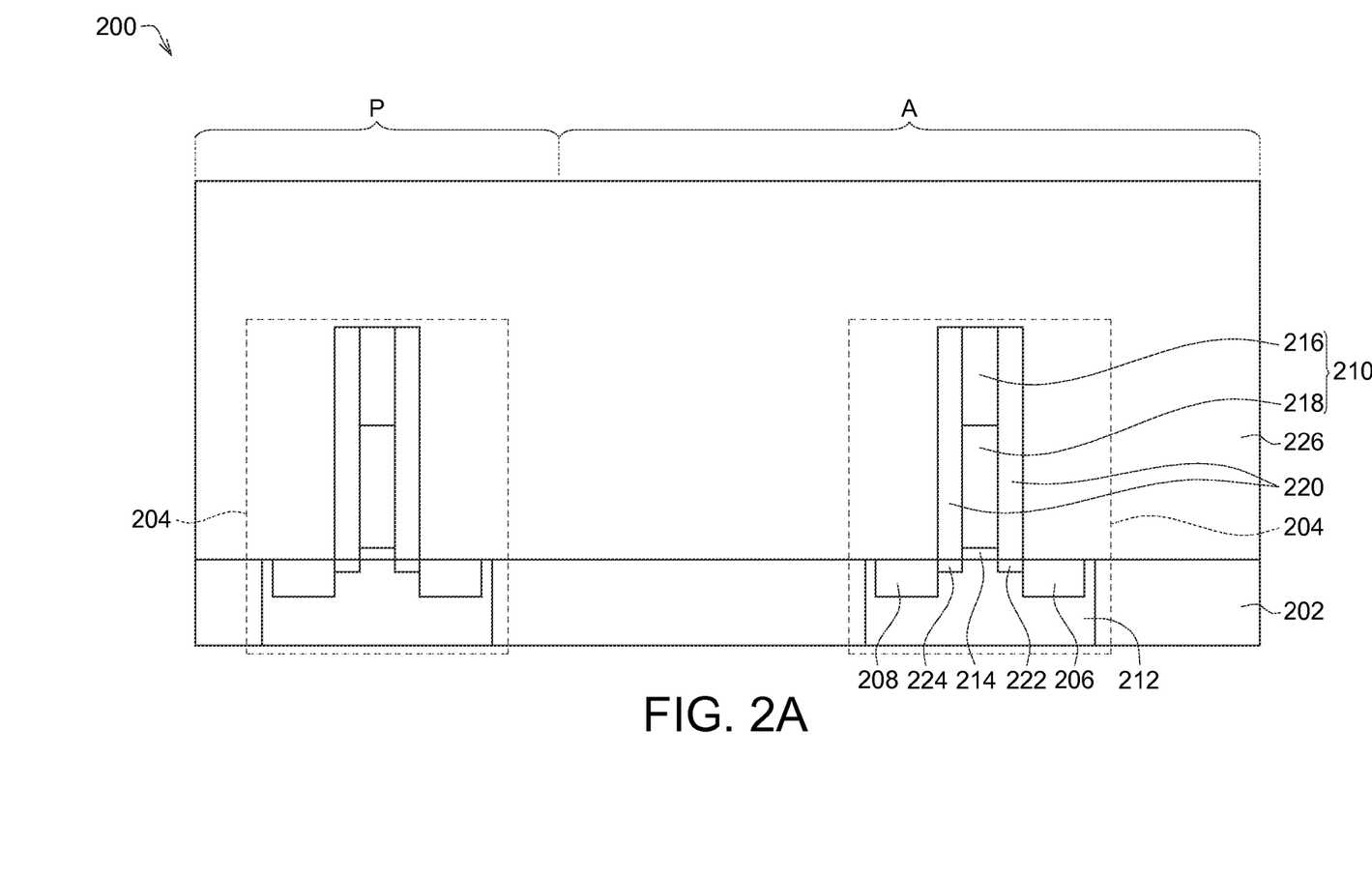
FIGS. 2A-2J illustrate a method for manufacturing a semiconductor structure according to embodiments.

The disclosure is now directed to a method for manufacturing a semiconductor structure according to embodiments. Referring to FIG. 2A, a preliminary structure 200 is provided. The preliminary structure 200 comprises an access device and a dielectric layer 226 (such as an interlayer dielectric layer) covering the access device.

In some embodiments, as shown in FIG. 2A, the access device may be a transistor 204, such as a NMOS. The transistor 204 comprises two source/drain regions 206 and 208 and a gate electrode 210, wherein the two source/drain regions 206 and 208 are said two terminals. According to some embodiments, the semiconductor structure may comprise a substrate 202, and the source/drain regions 206 and 208 are formed in the substrate 202. More specifically, source/drain regions 206 and 208 may be formed in a well 212 disposed in the substrate 202. The gate electrode 210 is formed on the substrate 202 between the source/drain regions 206 and 208, and the gate electrode 210 is separated from the substrate 202 by a gate dielectric 214 of the transistor 204. According to one embodiment, as shown in FIG. 2A, the gate electrode 210 may comprise an upper layer 216 and a lower layer 218, the upper layer 216 comprises metal silicide, such as $CoSi_x$ or $WSi_x$, and the lower layer 218 comprises polysilicon. The transistor may further comprise spacers 220 formed on sidewalls of the gate electrode 210. The transistor may further comprise two light-doped drift regions 222 and 224 adjacent to the source/drain regions 206 and 208, respectively.

It is noted that the preliminary structure 200 may comprise a plurality of transistors 204, some of which are formed in an array region A of the preliminary structure 200, and others are formed in a peripheral region P of the preliminary structure 200. The following steps, unless being particularly pointed out, may be conducted in both the array region A and the peripheral region P.

Figure 2B:
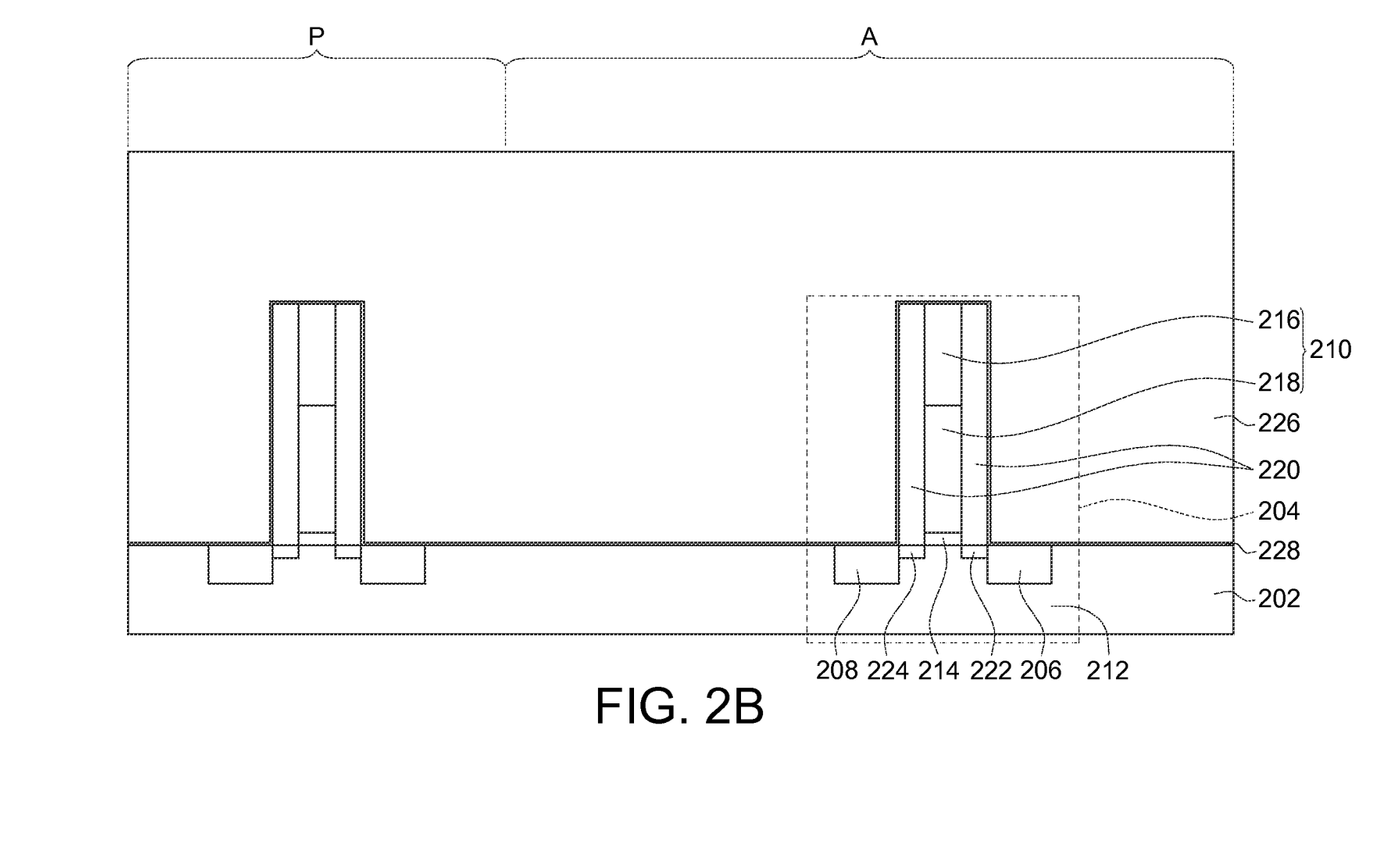

According to some embodiments, as shown in FIG. 2B, a process under a gas atmosphere comprising hydrogen may be optionally conducted. The process may be an $N_2$—$H_2$ alloy forming process. It can be used to form a borderless contact layer 228 conformally over the transistor 204 before the dielectric layer 226 is formed. Such a process is beneficial for larger process window of contact etch.

Figure 2C:
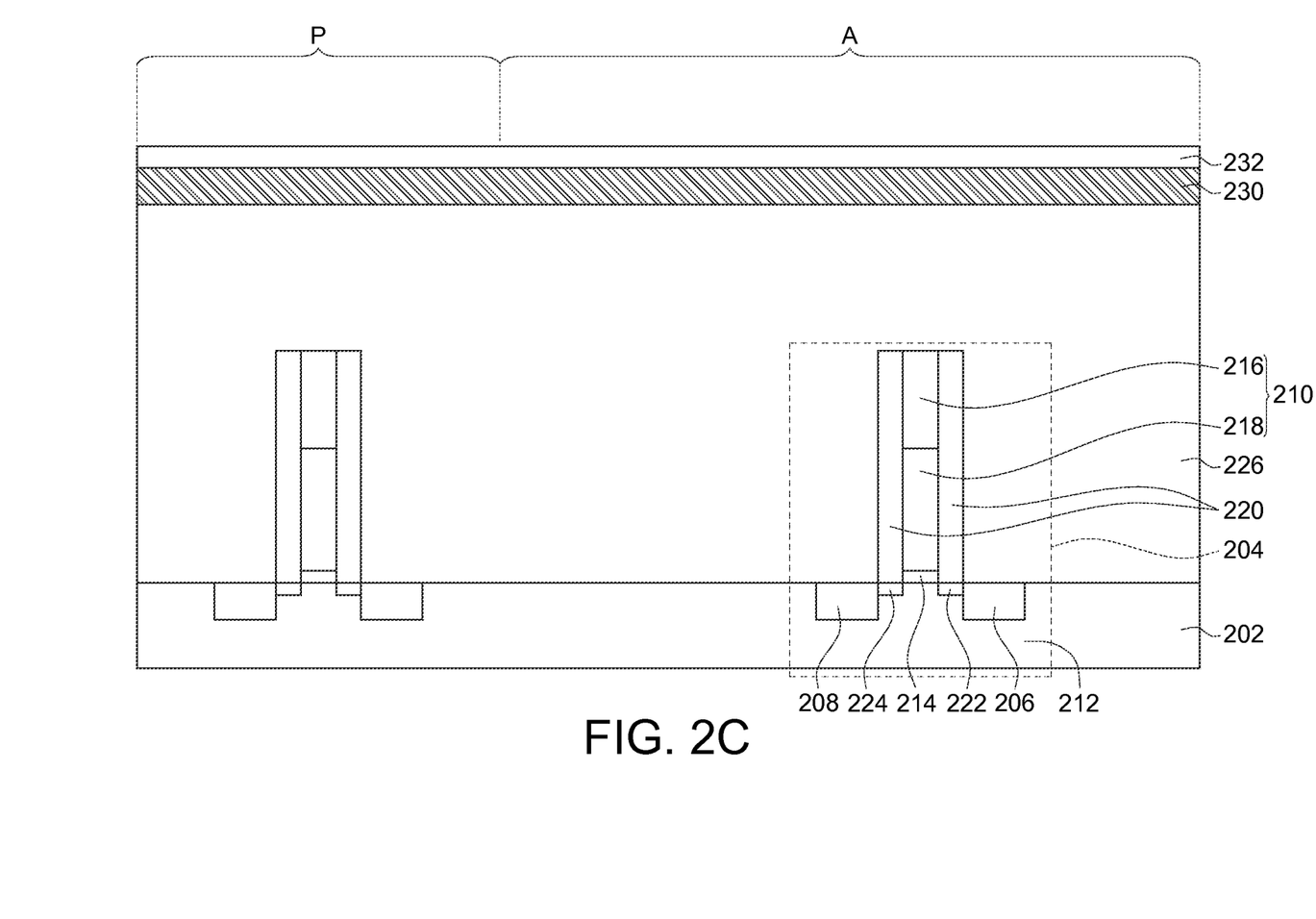

Now referring to FIG. 2C, after the provision of the preliminary structure 200, a barrier layer 230 is formed on the dielectric layer 226. According to some embodiments, the barrier layer 230 substantially covers the whole dielectric layer 226 in the array region A, and optionally covers the whole dielectric layer 226 in the peripheral region P. The barrier layer 230 may comprise a material having a hydrogen barrier effect, such as, but not limited to, silicon nitride ($SiN_x$). For example, the barrier layer 230 may be formed of $SiN_x$ under a low pressure at a temperature higher than 400° C., such as about 600° C. to about 700° C. By such a high temperature forming process, a low hydrogen containing barrier layer 230 can be provided. According to one embodiment, the barrier layer 124 may be about 30 Å to about 1000 Å, generally be about 100 Å to about 200 Å. In some embodiments, as shown in FIG. 2C, a hard mask layer 232 may be provided on the barrier layer 230. The hard mask layer 232 may be made of oxide.

Figure 2D:
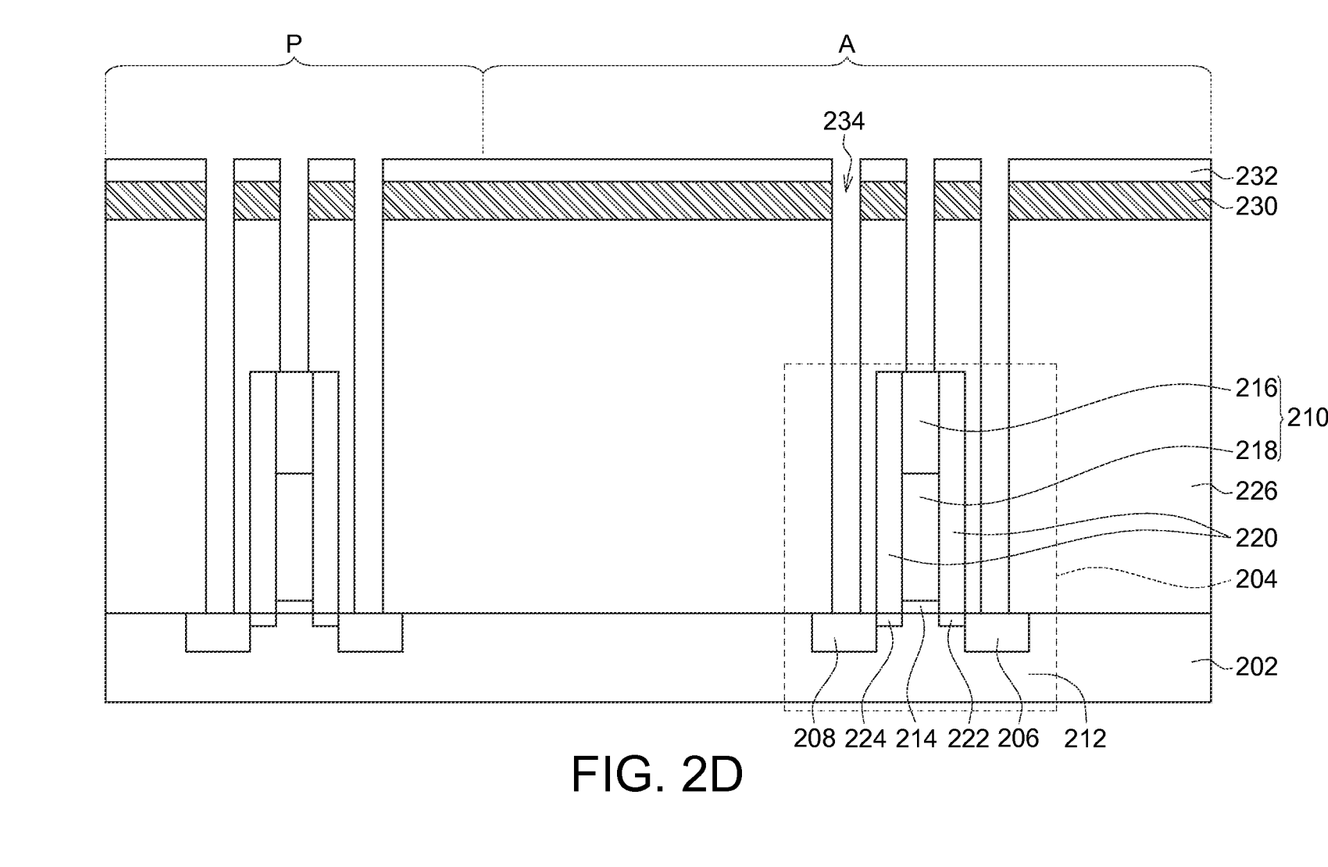

Referring to FIG. 2D, a plurality of holes 234 are formed through the hard mask layer 232, the barrier layer 230 and the dielectric layer 226. Each of them exposes a portion of the source/drain region 206 (i.e., a portion of one terminal), a portion of the source/drain region 208 (i.e., a portion of the other terminal), or a portion of the gate electrode 210 (it is for the case using the transistor 204).

Figure 2E:
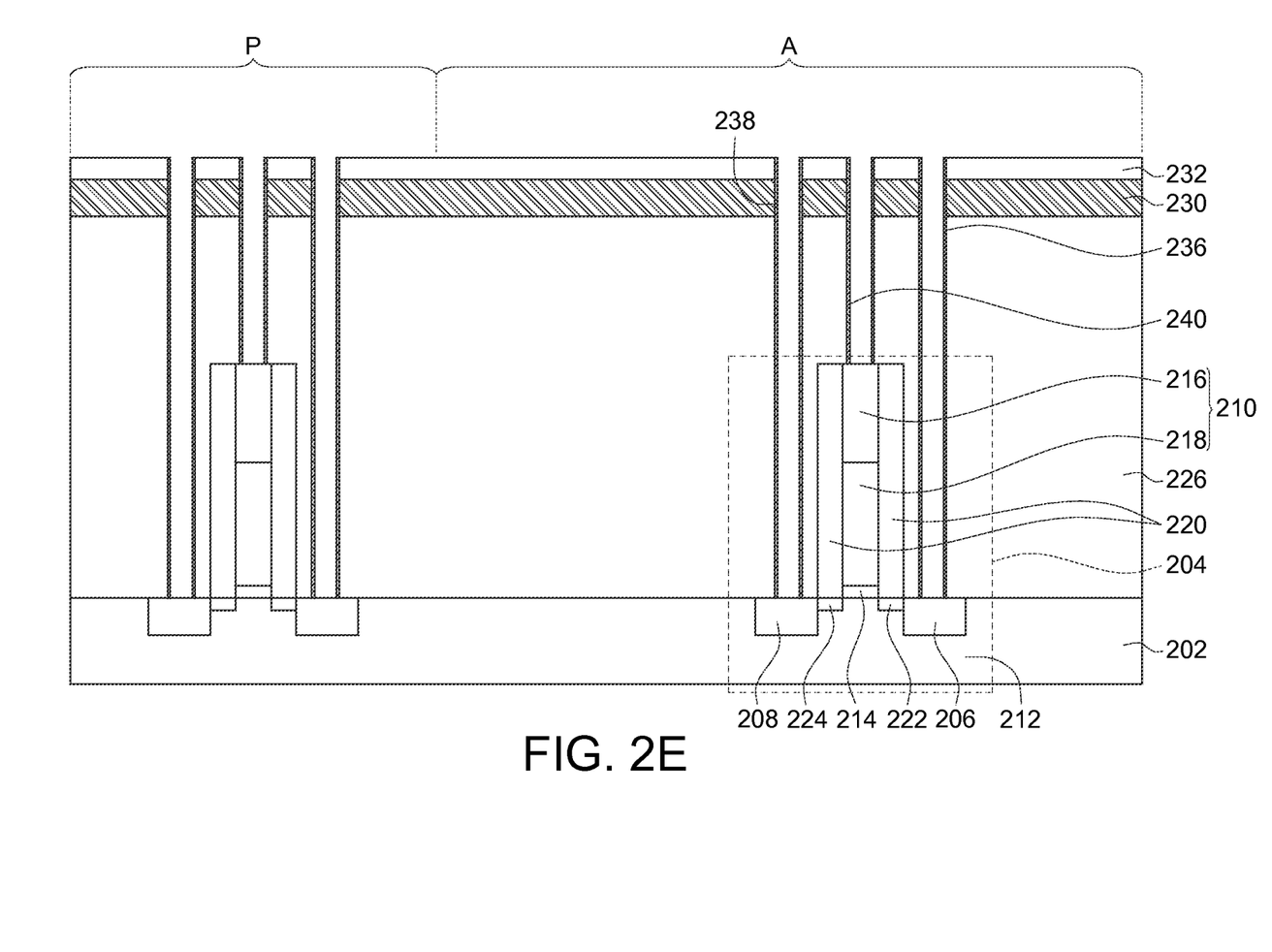

Referring to FIG. 2E, a plurality of barrier liners are formed on sidewalls of the plurality of holes 234, respectively. The plurality of barrier liners comprises a first barrier liner 236 and a second barrier liner 238. The first barrier liner 236 is formed on the sidewall of the hole 234 exposing a portion of the source/drain region 206. The second barrier liner 238 is formed on the sidewall of the hole 234 exposing a portion of the source/drain region 208. In the cases that the transistor 204 is used, the plurality of barrier liners further comprises a third barrier liner 240. The third barrier liner 240 is formed on the sidewall of the hole 234 exposing a portion of the gate electrode 210. The barrier liners may comprise a material having a hydrogen barrier effect, such as, but not limited to, silicon nitride ($SiN_x$). The barrier liners may be formed by deposition and etching processes. Each barrier liner may have a thickness of about 20 Å to about 300 Å, typically about 50 Å.

Figure 2F:
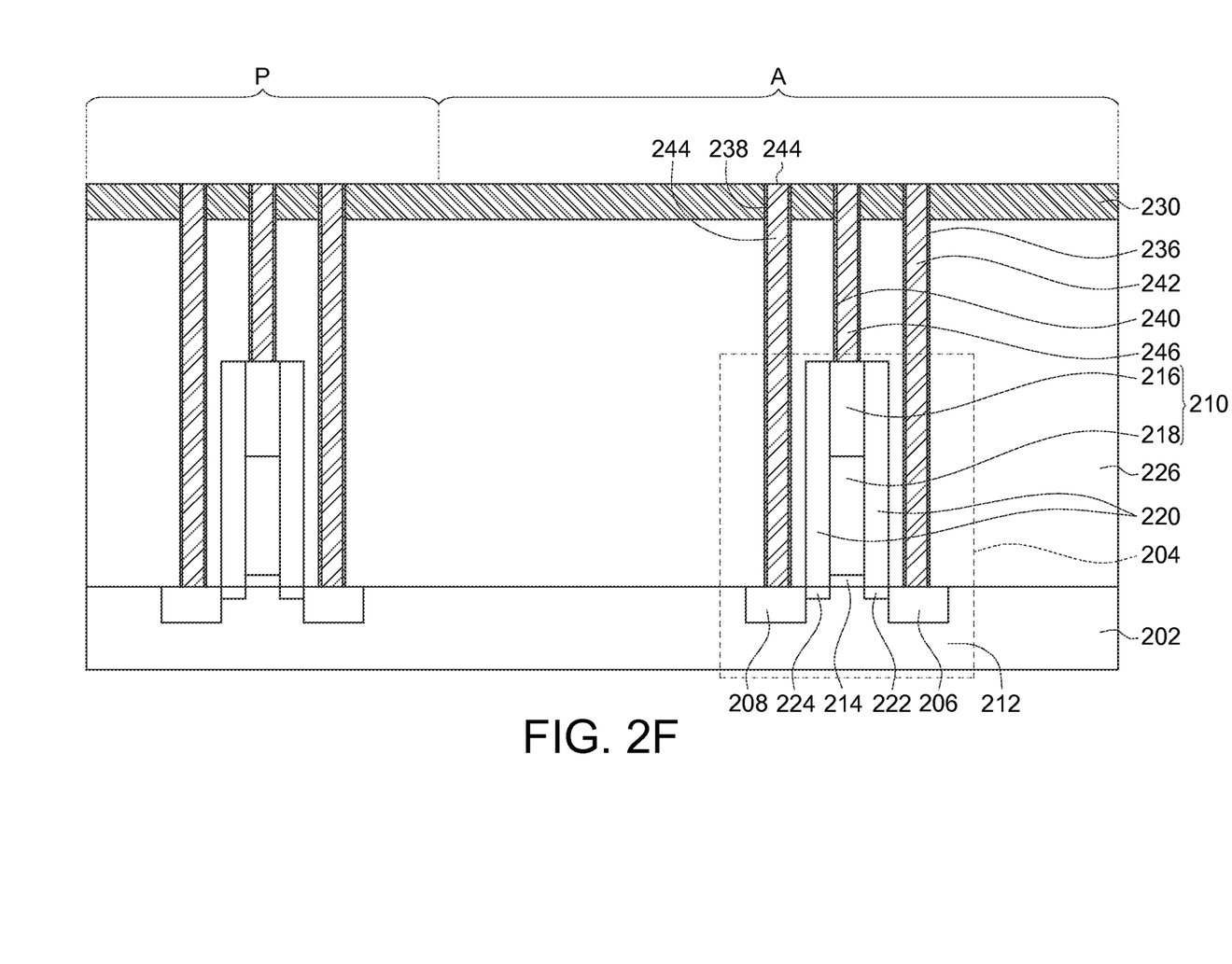

Referring to FIG. 2F, a conductive material is filled into the holes 234 to form a plurality of interlayer conductors. The plurality of interlayer conductors comprises a first interlayer conductor 242 and a second interlayer conductor 244. The first interlayer conductor 242 is connected to the source/drain region 206 (i.e. one of the two terminals), and physically separated from the dielectric layer 226 by the first barrier liner 236. The second interlayer conductor 244 is connected to the source/drain region 208 (i.e. the other one of the two terminals), and physically separated from the dielectric layer 226 by the second barrier liner 238. In the cases that the transistor 204 is used, the plurality of interlayer conductors further comprises a third interlayer conductor 246. The third interlayer conductor 246 is connected to the gate electrode 210 and physically separated from the dielectric layer 226 by the third barrier liner 240. The conductive material may comprise tungsten (W). The conductive material may further comprise titanium (Ti) and titanium nitride (TiN). This step may comprise the deposition of the conductive material and a following chemical mechanical polishing (CMP) process. Further, the hard mask layer 232 may also be removed by the CMP process.

Then, a memory element 248 will be formed on the first interlayer conductor 242, and a top electrode layer 254 will be formed on the barrier layer 230 and the memory element 248, wherein the top electrode layer 254 covers the memory element 248.

Figure 2G:
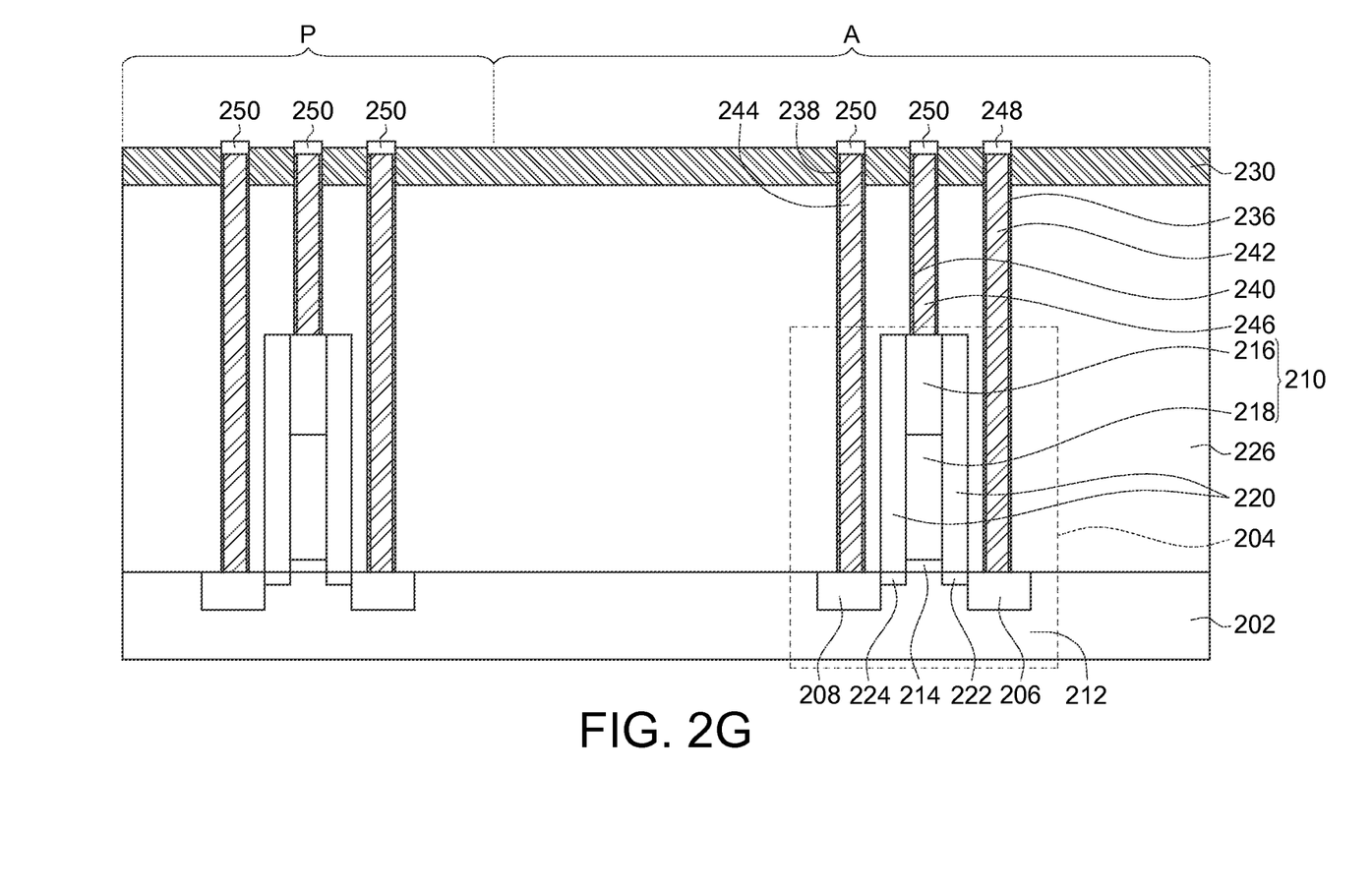

Referring to FIG. 2G, a plurality of memory elements are formed on the interlayer conductors, respectively. The plurality of memory element comprises the memory element 248 formed on the first interlayer conductor 242 in the array region A. The plurality of memory element further comprise other memory elements 250 formed on other interlayer conductors in the array region A or the interlayer conductors in the peripheral region P. The memory elements may be formed by oxidizing top portions of the interlayer conductors. For example, the memory elements may be formed of tungsten oxide by oxidation of the tungsten of the interlayer conductors. The oxidation process may be rapid thermal oxidation (RTO), plasma oxidation, PRP (plasma-RTO-plasma) process, or the like. According to one embodiment, the memory elements may be about 10 Å to about 1000 Å, such as about 100 Å.

Figure 2H:
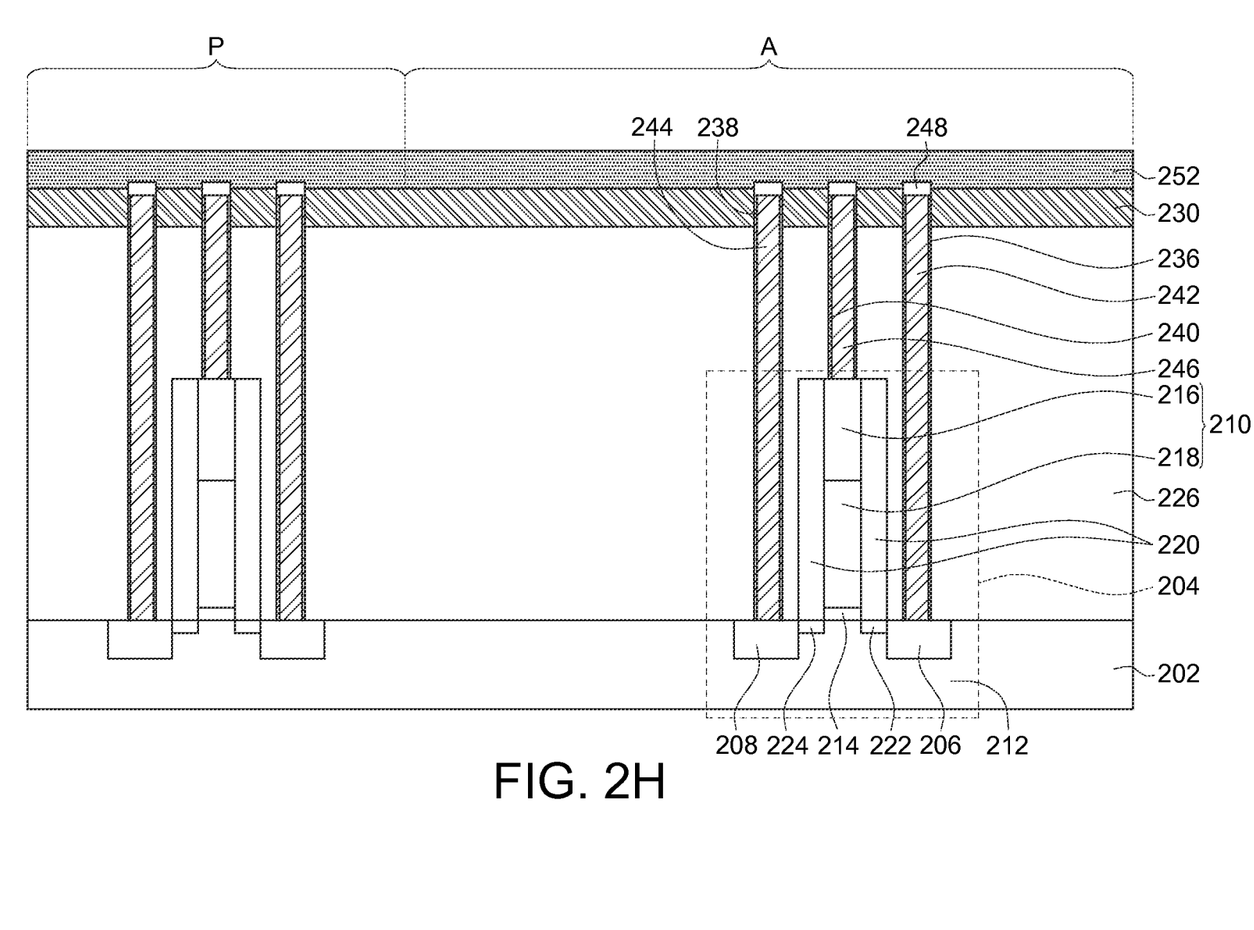

Referring to FIG. 2H, a top electrode layer 252 is formed covering the whole barrier layer 230 and all of the memory elements 248 and 250. In some embodiments, the top electrode layer 252 may be formed conformally. The top electrode layer 252 may comprise a material having a hydrogen barrier effect, such as, but not limited to, titanium nitride (TiN) or titanium aluminum nitride (TiAlN). For example, the top electrode layer 252 may be formed of TiN by physical vapor deposition (PVD). According to one embodiment, the top electrode layer 252 may be about 50 Å to about 1000 Å, typically be about 200 Å to about 300 Å.

Figure 2I:
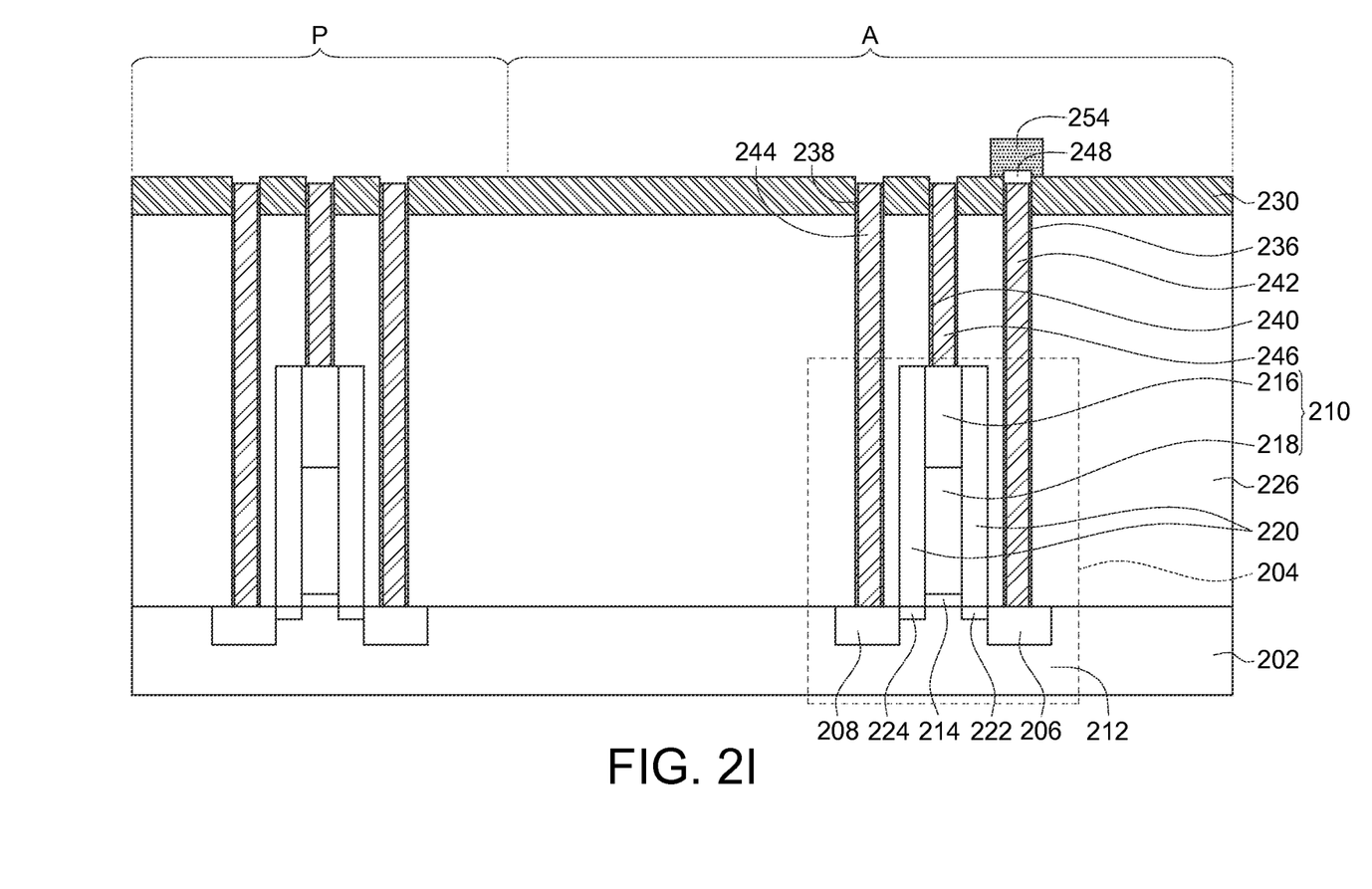

Referring to FIG. 2I, most of the top electrode layer 252 are removed, and only the portion that forms on the memory element 248 (i.e. the top electrode layer 254) is remained. The top electrode layer 254 covers the memory element 248. Further, the exposed memory elements 250 are all removed. This step is carried out, for example, by an etching process. Thereafter, a plasma clean process may be optionally conducted to provide better interfaces with a metal layer 256 formed in the following steps.

As such, a RRAM device comprising the memory element 248 is provided, and the top electrode layer 254 and the first interlayer conductor 242 provide the top and bottom electrodes of the memory element 248. The memory element 248 is controllable by the transistor 204 by the connection with the source/drain region 206. In some embodiments, the source/drain region 206 is the drain region of the transistor 204.

Figure 2J:
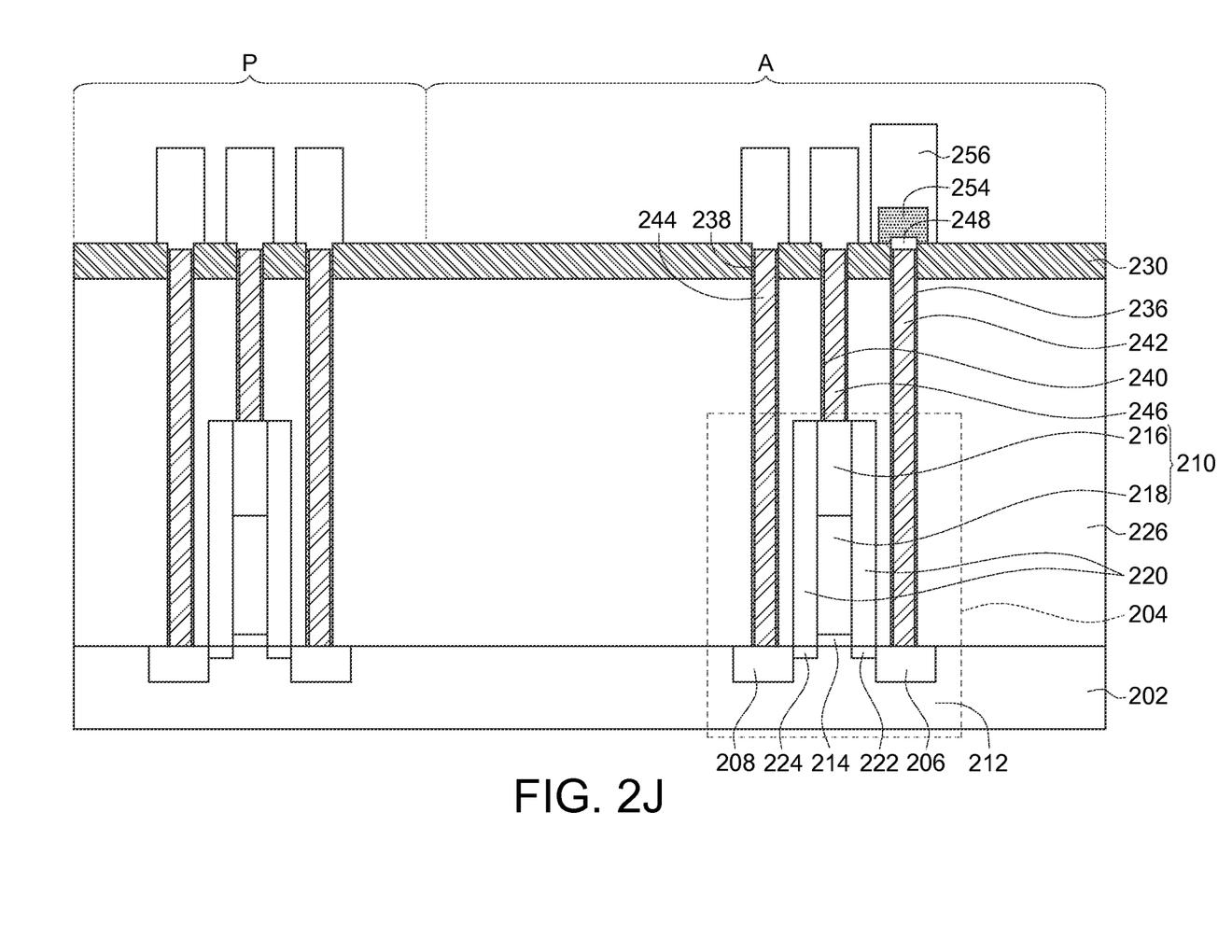

Referring to FIG. 2J, a metal layer 256 is formed on the dielectric layer 226. The metal layer 256 is connected to the top electrode layer 254, the second interlayer conductor 244 and the third interlayer conductor 246. The metal layer 256 may be formed by deposition and patterning processes. For example, the metal layer 256 may be a Ti/TiN/Al/Ti/TiN five layer structure formed by PVD.

The steps described above are compatible to a typical CMOS manufacturing process. After the formation of the metal layer 256, conventional BEOL process may be conducted.

In summary, a barrier structure, particularly a hydrogen barrier structure, is provided according to the embodiments described herein. The barrier liners prevent a hydrogen diffusion from the dielectric layer to the interlayer conductors. The barrier layer and the top electrode layer encapsulate the memory element, and thus prevent a hydrogen diffusion from a processing atmosphere or other components to the memory element. In particular, the barrier layer prevents a hydrogen diffusion from a component disposed at a lower level, such as the dielectric layer. Further, the metal layer may also provide a hydrogen barrier function. As such, a degradation of the semiconductor structure caused by the hydrogen diffusion may be prevented. In particular, a degradation of the memory element caused by the hydrogen diffusion may be prevented.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
    an access device having two terminals;
    a dielectric layer covering the access device;
    a barrier layer disposed on the dielectric layer;
    a first interlayer conductor extending through the barrier layer and the dielectric layer, wherein the first interlayer conductor is connected to one of the two terminals;
    a first barrier liner disposed on a sidewall of the first interlayer conductor, wherein the first interlayer conductor is physically separated from the dielectric layer by the first barrier liner;
    a second interlayer conductor extending through the barrier layer and the dielectric layer, wherein the second interlayer conductor is connected to the other one of the two terminals;
    a second barrier liner disposed on a sidewall of the second interlayer conductor, wherein the second interlayer conductor is physically separated from the dielectric layer by the second barrier liner;
    a memory element disposed on the first interlayer conductor; and
    a top electrode layer disposed on the barrier layer and the memory element, the top electrode layer covering the memory element.

2. The semiconductor structure according to claim 1, wherein the first barrier liner, the second barrier liner, the barrier layer and the top electrode layer are configured to be hydrogen barriers.

3. The semiconductor structure according to claim 1, wherein the barrier layer comprises silicon nitride.

4. The semiconductor structure according to claim 1, wherein the first barrier liner and the second barrier liner comprise silicon nitride.

5. The semiconductor structure according to claim 1, wherein the top electrode layer comprises titanium, titanium nitride or titanium aluminum nitride.

6. The semiconductor structure according to claim 1, wherein the memory element has a programmable resistance.

7. The semiconductor structure according to claim 1, wherein the memory element comprises tungsten oxide.

8. The semiconductor structure according to claim 1, wherein the memory element has a thickness of 10 to 1000 Å.

9. The semiconductor structure according to claim 1, wherein the access device is a transistor comprising two source/drain regions and a gate electrode, and the two source/drain regions are the two terminals.

10. The semiconductor structure according to claim 9, further comprising:
    a third interlayer conductor extending through the barrier layer and the dielectric layer, wherein the third interlayer conductor is connected to the gate electrode; and
    a third barrier liner disposed on a sidewall of the third interlayer conductor, wherein the third interlayer conductor is physically separated from the dielectric layer by the third barrier liner.

11. The semiconductor structure according to claim 10, further comprising:
    a metal layer disposed on the dielectric layer, wherein the metal layer is connected to the top electrode layer, the second interlayer conductor and the third interlayer conductor.

12. The semiconductor structure according to claim 9, wherein the gate electrode comprises an upper layer and a lower layer, the upper layer comprises metal silicide, and the lower layer comprises polysilicon.

13. The semiconductor structure according to claim 1, comprising a RRAM device, wherein the RRAM device comprises the memory element.

14. A method for manufacturing a semiconductor structure, comprising:
    providing a preliminary structure, the preliminary structure comprising an access device and a dielectric layer covering the access device, wherein the access device has two terminals;
    forming a barrier layer on the dielectric layer;
    forming two holes through the barrier layer and the dielectric layer, the two holes exposing portions of the two terminals, respectively;
    forming a first barrier liner and a second barrier liner on sidewalls of the two holes, respectively;
    forming a first interlayer conductor and a second interlayer conductor in the two holes, respectively, wherein the first interlayer conductor is connected to one of the two terminals and physically separated from the dielectric layer by the first barrier liner, and the second interlayer conductor is connected to the other one of the two terminals and physically separated from the dielectric layer by the second barrier liner;
    forming a memory element on the first interlayer conductor; and
    forming a top electrode layer on the barrier layer and the memory element, wherein the top electrode layer covers the memory element.

15. The method according to claim 14, wherein the first barrier liner, the second barrier liner, the barrier layer and the top electrode layer are configured to be hydrogen barriers.

16. The method according to claim 14, wherein the access device is a transistor comprising two source/drain regions and a gate electrode, and the two source/drain regions are the two terminals.

17. The method according to claim 16, further comprising:
    forming another hole through the barrier layer and the dielectric layer at the same step of forming the two holes, the another hole exposing a portion of the gate electrode;
    forming a third barrier liner on a sidewall of the another hole at the same step of forming the first barrier liner and the second barrier liner; and forming a third interlayer conductor in the another hole at the same step of forming the first interlayer conductor and the second interlayer conductor, wherein the third interlayer conductor is connected to the gate electrode and physically separated from the dielectric layer by the third barrier liner.

18. The method according to claim 17, further comprising:

forming a metal layer on the dielectric layer, wherein the metal layer is connected to the top electrode layer, the second interlayer conductor and the third interlayer conductor.

19. The method according to claim 14, further comprising:

before forming the barrier layer, conducting a process under a gas atmosphere comprising hydrogen.

20. The method according to claim 14, wherein the memory element is formed by oxidizing a top portion of the first interlayer conductor.

* * * * *